United States Patent [19]
Wirt

[11] Patent Number: 6,003,121
[45] Date of Patent: Dec. 14, 1999

[54] SINGLE AND MULTIPLE CHANNEL MEMORY DETECTION AND SIZING

[75] Inventor: Lynda M. Wirt, Folsom, Calif.

[73] Assignee: Intel Corporation, Santa Clara, Calif.

[21] Appl. No.: 09/080,872

[22] Filed: May 18, 1998

[51] Int. Cl.[6] .................................................... G06F 12/00
[52] U.S. Cl. ................................ 711/170; 711/105; 711/5
[58] Field of Search ................................ 711/5, 105, 170, 711/172

[56] References Cited

U.S. PATENT DOCUMENTS

| | | | |
|---|---|---|---|
| 5,390,308 | 2/1995 | Ware et al. | 711/5 |
| 5,701,438 | 12/1997 | Bains | 711/211 |
| 5,748,554 | 5/1998 | Barth et al. | 365/230.03 |
| 5,799,209 | 8/1998 | Chatter | 710/56 |
| 5,913,046 | 6/1999 | Barth et al. | 711/105 |

OTHER PUBLICATIONS

Crisp, R, "Direct RAMBUS Technology: The New Main Memory Standard", IEEE Pub 0272–1732/97, 1997.
Garrett B, "RDRAMs: A New Speed Paradigm", IEEE Pub 1063–6390/94, 1994.
Crisp, R, "High Bandwidth RDRAM Technology Reduces System Cost", IEEE Pub 1063–6390/96, 1996.

*Primary Examiner*—John W. Cabeca
*Assistant Examiner*—Christopher S. Chow
*Attorney, Agent, or Firm*—Seth Z. Kalson

[57] ABSTRACT

A method for BIOS code for detecting and grouping memory devices connected to one or more memory channels, comprising reading characteristics of a memory device and if the characteristics have not been previously read, then programming device ID and group ID registers based upon a device counter and a group counter, respectively. The method further includes steps for properly incrementing the device and group counters so that additional memory devices on the channel may be read and grouped.

22 Claims, 13 Drawing Sheets

SINGLE AND MULTIPLE CHANNEL MEMORY DETECTION AND SIZING

FIELD OF INVENTION

The present invention relates to a method for detecting and grouping memory devices according to their characteristics during boot-up of a computer system.

BACKGROUND

To increase system memory performance in computers, memory devices with interleaved banks of memory cells can be employed. For example, Rambus Inc. provides technology for an integrated memory device, the Direct RDRAM™ (Rambus dynamic random access memory), employing interleaved banks of memory cells, along with a protocol for connecting a number of such memory devices to a memory channel, called a Direct Rambus™ Channel or Direct RDRAM™ Channel. A plurality of such memory devices are provided in a module, called the Direct Rambus™ RIMM module (Rambus in-line memory module), which may contain one or more Direct Rambus™ Channels. Direct Rambus™ and Direct RDRAM™ are trademarks of Rambus Inc., Mountain View, Calif.

It can be desirable for a memory system to comprise RDRAMs with varying characteristics. During boot-up of a computer system, the BIOS (basic input output system) code needs to determine how much memory is available for use. For Direct RDRAMs, their addresses need to be programmed, and the memory controller needs to provide efficient memory accesses to the various Direct RDRAM devices.

DETAILED DESCRIPTION OF EMBODIMENTS

Figure 1:
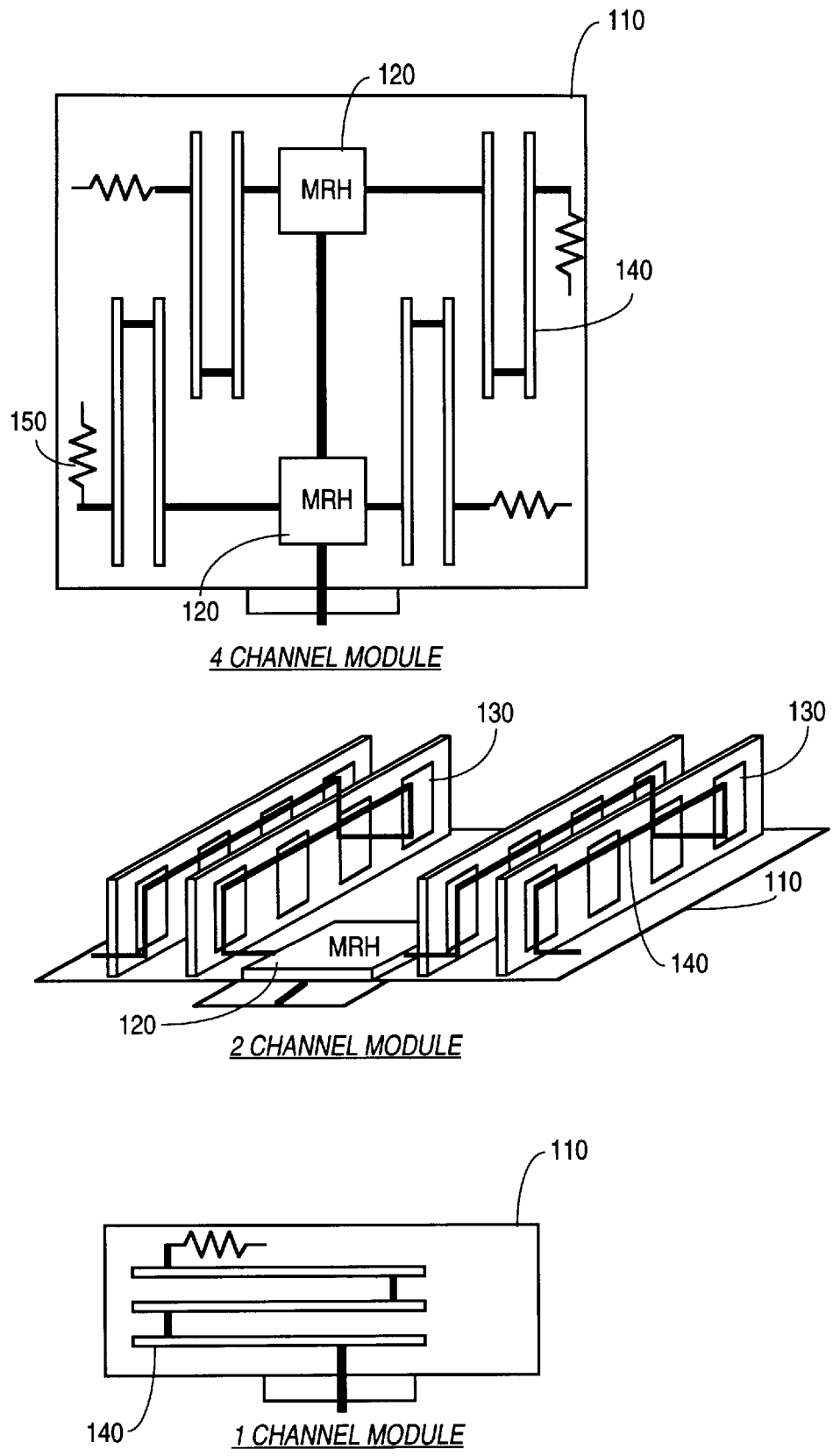
FIG. 1 is a high-level diagram of Direct Rambus RIMM modules.

FIG. 1 provides examples of RIMM modules 110 having one, two, and four Direct RDRAM Channels. RIMM modules with multiple Direct RDRAM Channels have Memory Repeater Hubs (MRH) 120 as shown in FIG. 1. Individual RDRAM devices 130 are indicated for the two-channel RIMM module only. The physical layer 140 of the Direct RDRAM Channels are indicated as shown, where terminators 150 provide proper termination for the Direct RDRAM Channels.

Figure 2:
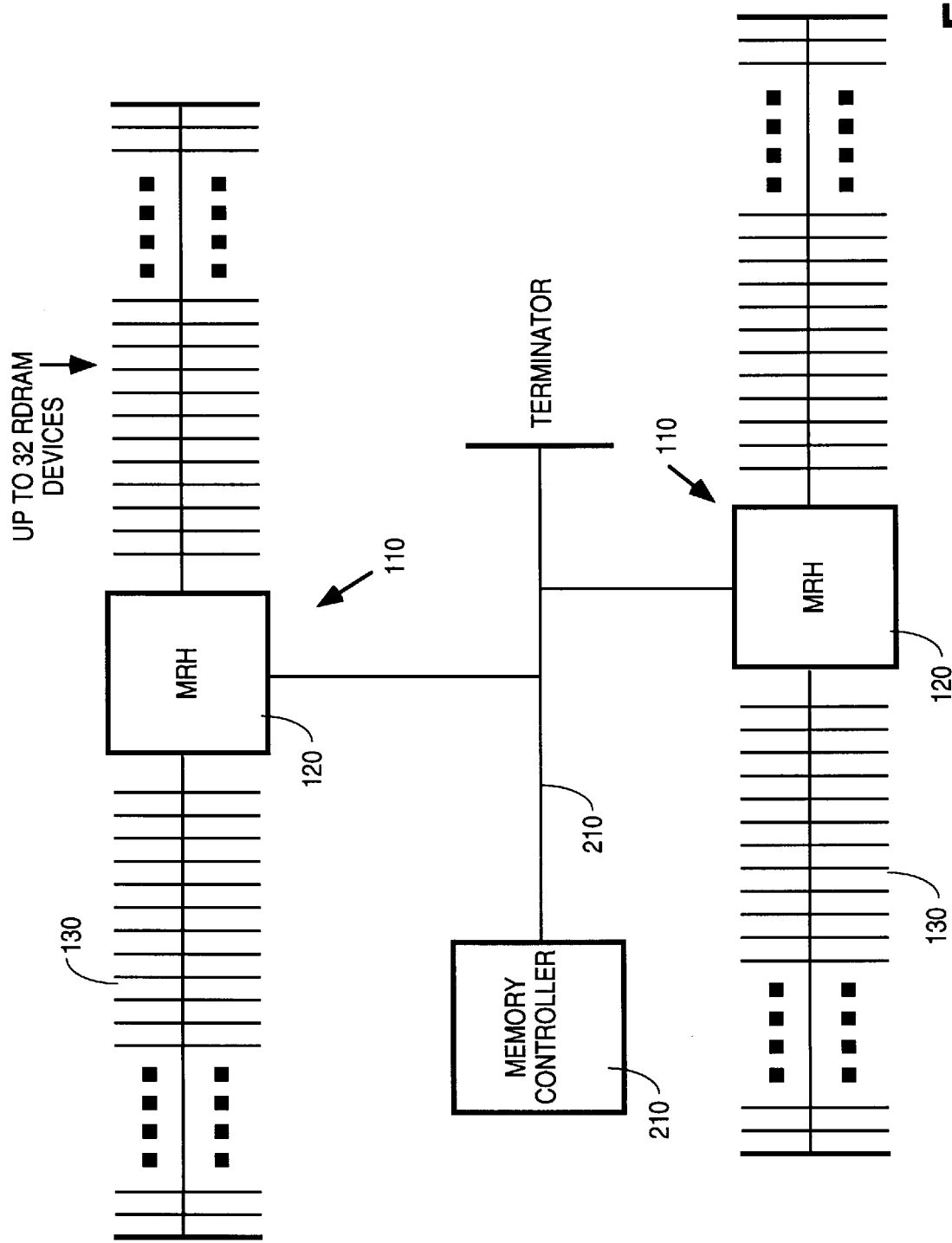
FIG. 2 is a high-level diagram of Direct Rambus RIMM modules with multiple channels and connected to a memory controller.
Figure 3:
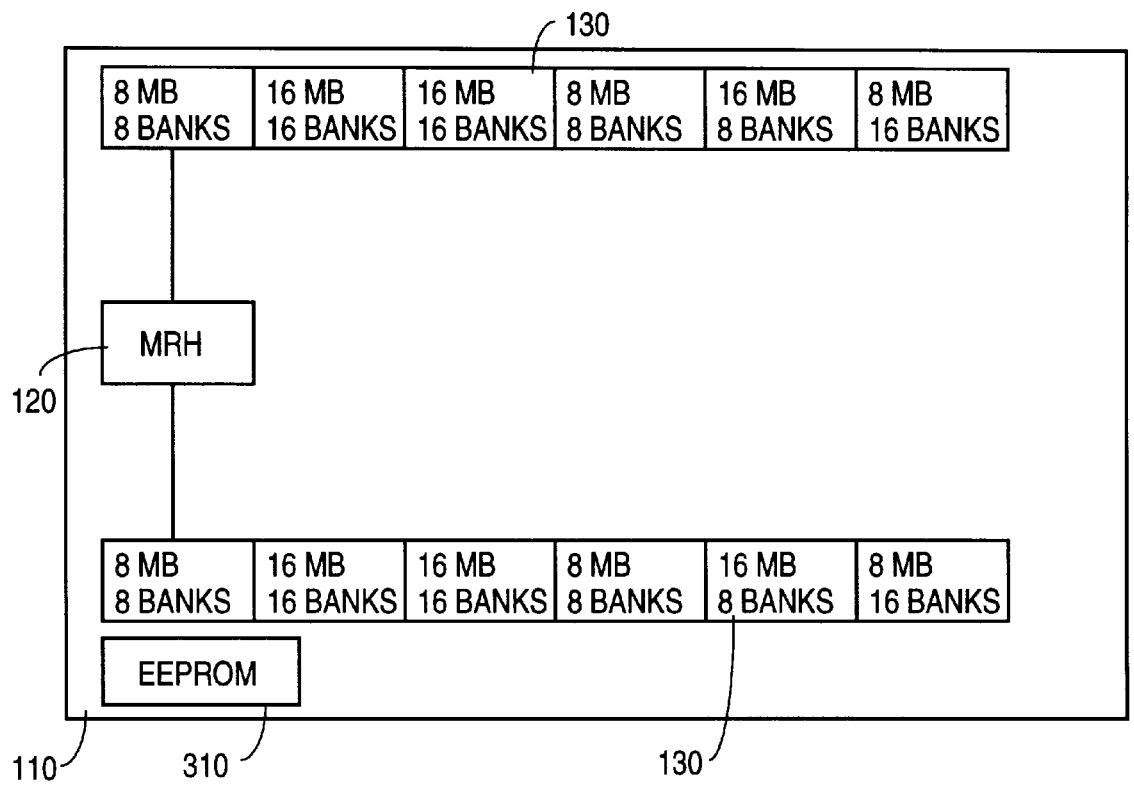
FIG. 3 is a high-level diagram of a two-channel Direct Rambus module with RDRAMs having varying characteristics on the channels.

Currently, each RDRAM Channel may contain up to 32 RDRAMs. More than one RIMM module 110 may be connected to memory controller 210, as shown in FIG. 2, via bus 220. Individual RDRAM devices have different characteristics, such as memory size, number of banks, page size, number of bank address bits, number of row address bits, number of column address bits, etc. For example, FIG. 3 is a high level diagram of a two-channel RIMM module with RDRAM devices having varying characteristics on each Direct RDRAM Channel. An EEPROM (electrically erasable programmable read only memory) 310 may be present with stored data regarding the various characteristics of RDRAMs present on an RIMM module. If no EEPROM is present, each RDRAM device on a RIMM module must be individually read to obtain its characteristics.

To provide efficient memory accesses via a memory controller to Direct RDRAMs having varying characteristics, the BIOS should efficiently detect, assign device IDs, and group according to characteristics various RDRAMs on one or more RIMM modules with one or more Direct RDRAM Channels.

Figure 4A:
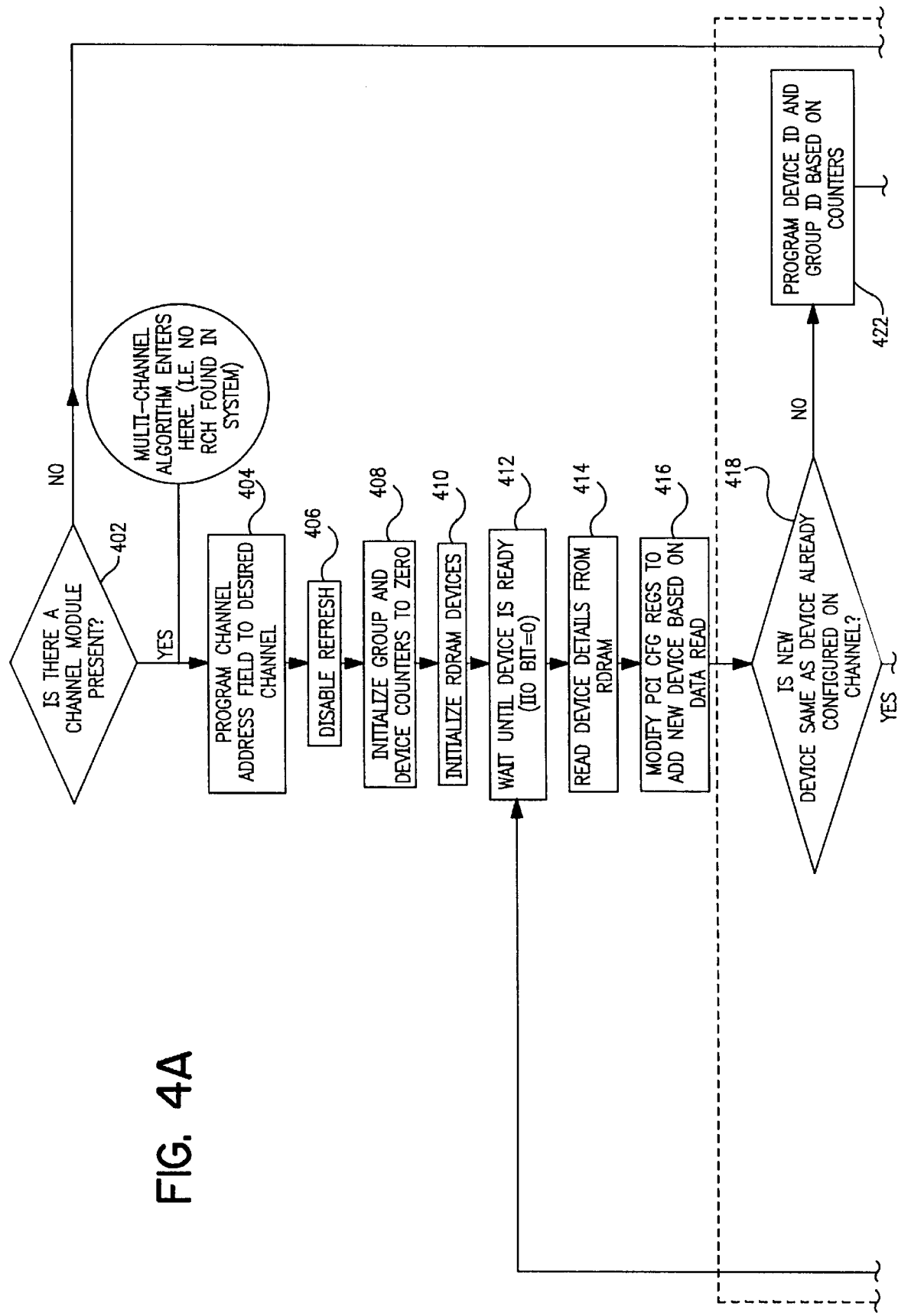
FIGS. 4a and 4b represent a flow diagram for BIOS code for detecting and grouping memory for a single-channel Direct Rambus RIMM module.
Figure 4B:
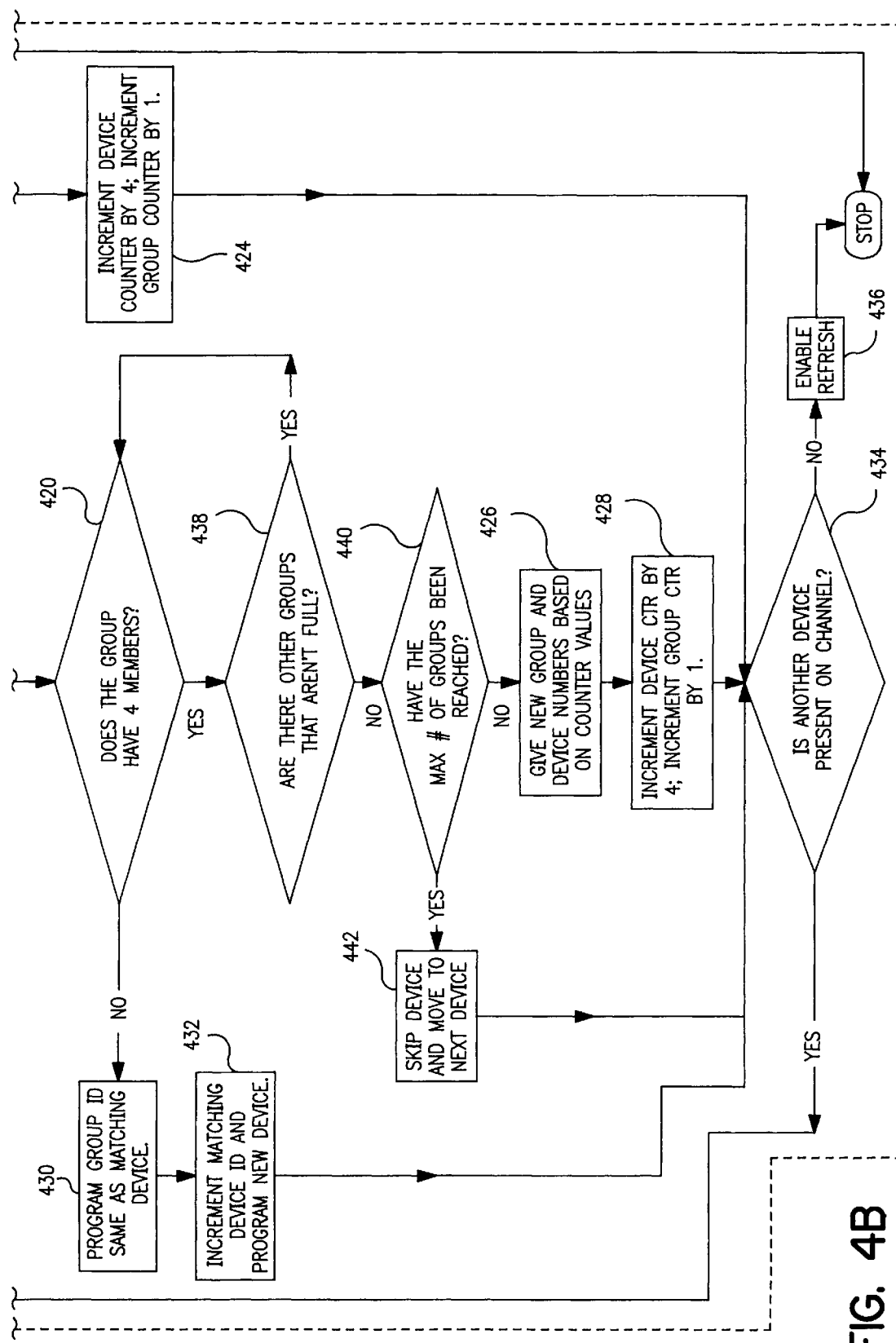

FIGS. 4a and 4b represent a flow diagram for BIOS code to provide device identification numbers for Direct RDRAMs connected to a single Direct RDRAM Channel and to group the RDRAMs according to their characteristics. In one embodiment, the maximum number of RDRAM devices to a group are four, and there is a maximum of eight groups in a memory channel. The BIOS code is firmware, and may be stored in such devices as EEPROM or flash memory. The BIOS code causes a processor to communicate with a memory controller, which communicates with system memory via a bus. In other embodiments, DRAM devices other than RDRAM devices may be employed provided individual DRAM devices can be identified by an address.

In one embodiment, to initialize a device once it is ready, the system BIOS should program the Initialization Control Management (RICM) register in a memory controller. In some embodiments, all Direct RDRAM devices respond to 1F(hex) in the Device Sequence Address before they have been assigned a device address by the system BIOS. Once the RICM register is programmed for a particular device, the Initiate Initialization Operation (IIO) is started. This command sends to the Direct RDRAM devices all data programmed in the RICM register and the Direct RDRAM devices return various data to the Device Register Data (DRD) register in the memory controller. The BIOS code can then read the DRD register and program all necessary PCI (Peripheral Component Interconnect) Configuration registers. The PCI Configuration registers reside in the memory controller. The device ID and group ID are then assigned, as described in more detail below. The device ID and group ID are stored in registers residing in the memory controller.

In step 402 it is determined whether a memory module is present. If so, then a channel identifier is stored in a channel address field, step 404. The channel address field is stored in a register located in the memory controller. Refresh is disabled in step 406.

The group counter and device counter are initialized to zero in step 408. The RDRAM devices are initialized in step 410. In step 412 the IIO bit is set to zero by the memory controller to indicate that the RDRAM device is ready. The IIO bit is in PCI Configuration space, i.e., a register in the memory controller. Direct RDRAM device characteristics are then read during step 414 and the PCI Configuration registers are then modified according to the data read. If the RIMM module contains EEPROM storing the RDRAM characteristics, then step 414 is modified to where the device characteristics are read directly from the EEPROM using serial presence detect. The remaining steps are directed toward properly grouping the RDRAM devices, as described below.

Step 418 determines whether the device characteristics read during step 414 have previously been read by the BIOS during memory configuration. If the device characteristics have not been previously read, then in step 422 the RDRAMs device and group IDs are programmed based upon the current device and group counters, and the device counter is incremented by four and the group counter is incremented by one in step 424.

If, however, in step 418 it is determined that the device characteristics have previously been read, then step 420 determines whether the group having those device characteristics is full, i.e., already has four members. If the group is full, then step 438 determines whether there are other empty groups with the same characteristics, and if so, then an empty group is chosen and step 420 is repeated. If step 438 determines that there are no other empty groups with the characteristics, then step 440 determines whether the maximum number of groups have been reached. If so, then in step 442 the device is skipped and flow control continues with step 434. If there are no other empty groups and the maximum number of groups have not been reached, then in step 426 the RDRAM device and group IDs are programmed based upon the current device and group counters, and these counters are incremented as indicated in step 428. If in step 420 it is determined that the group is not full, then in step 430 the RDRAM group ID is programmed to have the same ID as that group having the same characteristics, and in step 432 the device ID for the RDRAM is set equal to one more than the highest device ID of the matching group. Other embodiments may have group sizes not equal to four.

The above described steps therefore perform grouping of a RDRAM. Step 434 determines whether there are any more RDRAM devices on the Direct RDRAM Channel, and if so, control is brought back to step 412. If not, then refresh is enabled, step 436, and the grouping of the RDRAMs is finished.

Figure 5A:
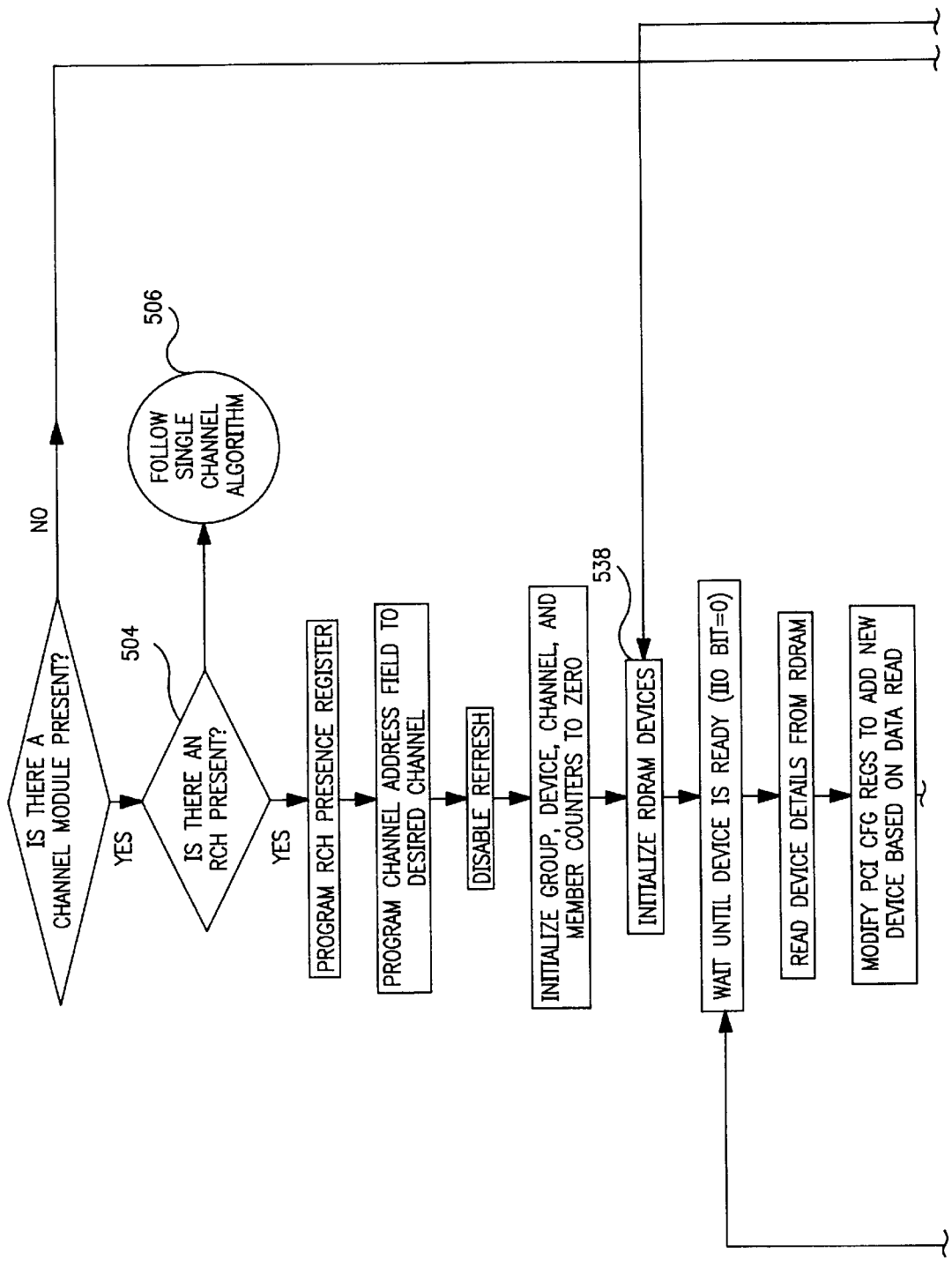
FIGS. 5a and 5b represent a flow diagram for BIOS code for detecting and grouping memory for a multi-channel Direct Rambus RIMM module where all memory devices on any given channel have the same characteristics.
Figure 5B:
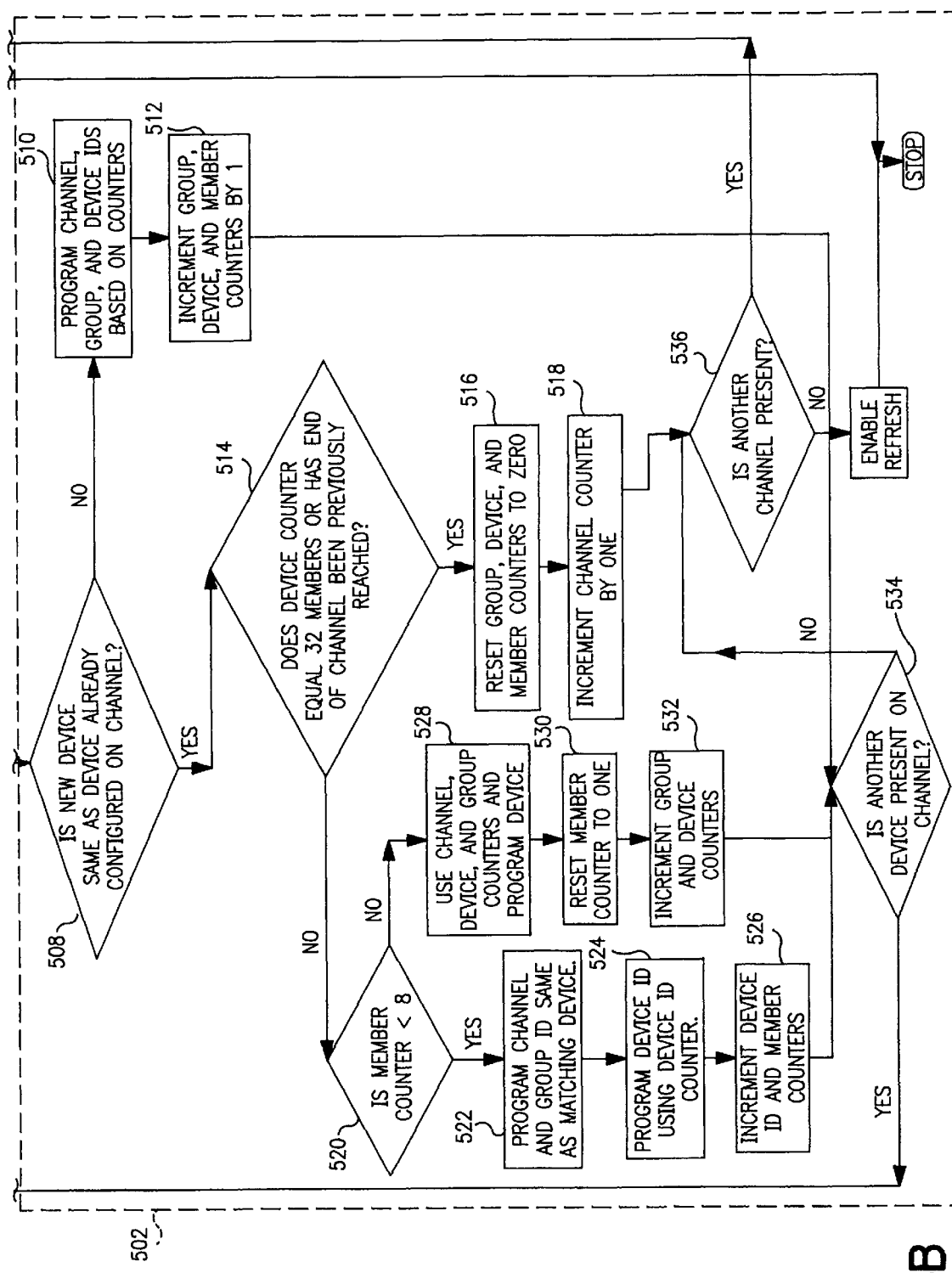

FIGS. 5a and 5b represent a flow diagram for BIOS code to assign device IDs to RDRAMs and to group them according to their characteristics for the case in which a RIMM module may have more than one Direct RDRAM Channel, but in which all the RDRAMs on any given channel have the same characterisitcs. The initial steps in FIG. 5 outside dashed area 502 are similar to steps 402–416 of FIG. 4, except that step 504 detects whether an MRH is present, and if not, then step 506 indicates that the steps of FIG. 4 are performed. The presence of an MRH implies a RIMM module with more than one Direct RDRAM Channel.

In addition to device and group counters, an embodiment according to FIG. 5 also comprises a channel counter and a member counter. The member counter limits the number of useable RIMMs on a memory channel to 32, although other embodiments may be limited to different values. If in step 508 it is determined that the characteristics of the newly read RDRAM have not been previously read, then the channel, group and device IDs are programmed according to the present values of the channel, group, and device counters, respectively, in step 510, and the group, device, and member counters are incremented by one in step 512. If, however, it is determined in step 508 that characteristics of the newly read RDRAM have been previously read, then step 514 is performed. If in step 514 it is determined that the device counter is 32 or if the end of the Direct RDRAM Channel has previously been reached, then step 516 resets the group, device, and member counters to zero, and step 518 increments the channel counter by one.

If step 514 is answered in the negative, then in step 520 it is determined whether the member counter is less than a group size, which for the embodiment of FIG. 5 is 8. If the member counter is less than 8, then step 522 programs the channel ID and group ID registers to equal that of the most recent previously read group of devices matching the characteristics of the newly read RDRAM, step 524 programs the device ID register using the device counter, and in step 526 the device and member counters are incremented. If, however, the member counter is equal to 8, then steps 528–532 are performed as indicated in FIG. 5. Note that after steps 534 or 518, step 536 determines whether there is another channel present, and if so, control is brought to step 538.

Figure 6A:
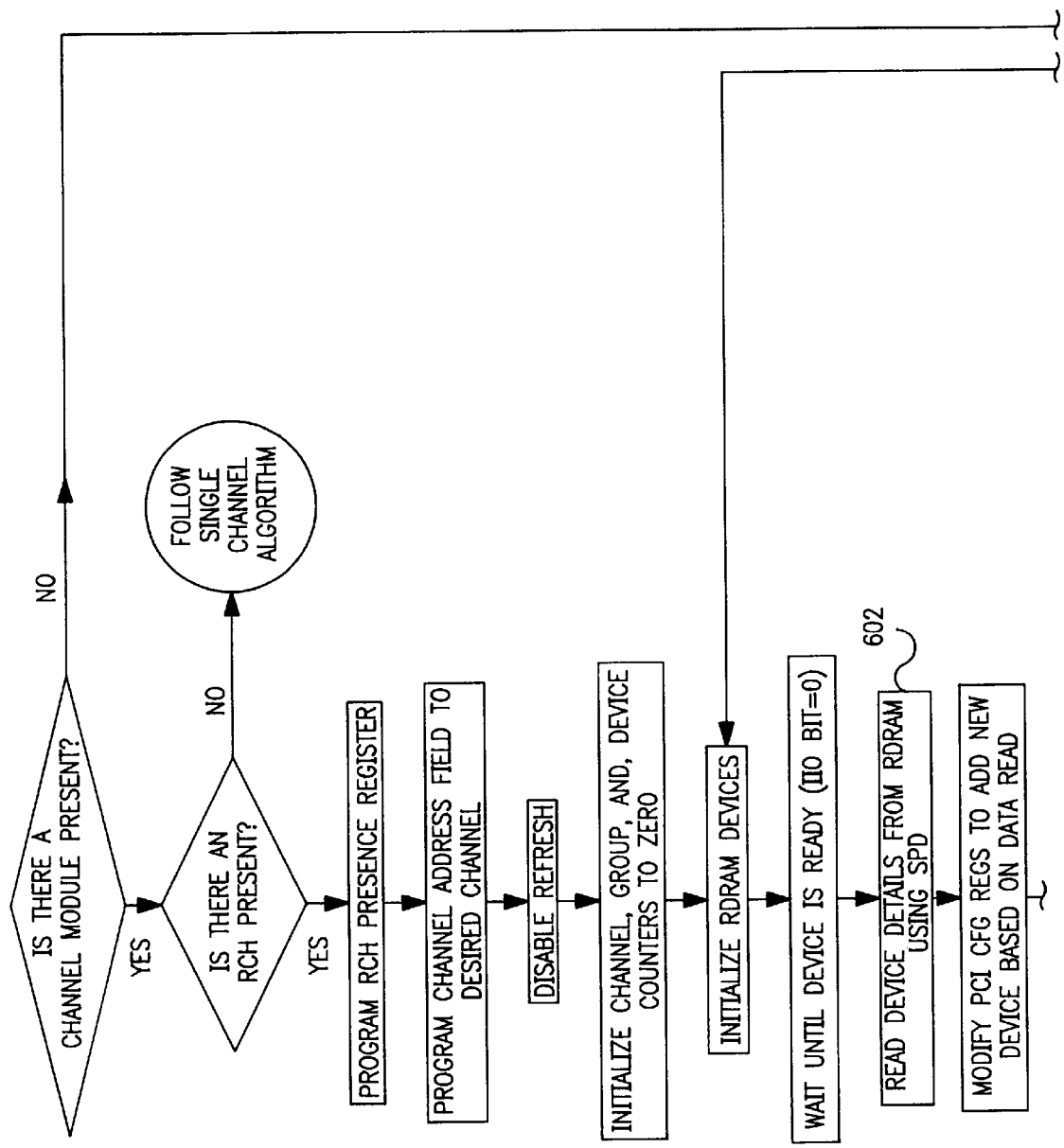
FIGS. 6a and 6b represent a flow diagram for BIOS code for detecting and grouping memory for a multi-channel Direct Rambus RIMM module where all memory devices on any given channel have the same characteristics.
Figure 6B:
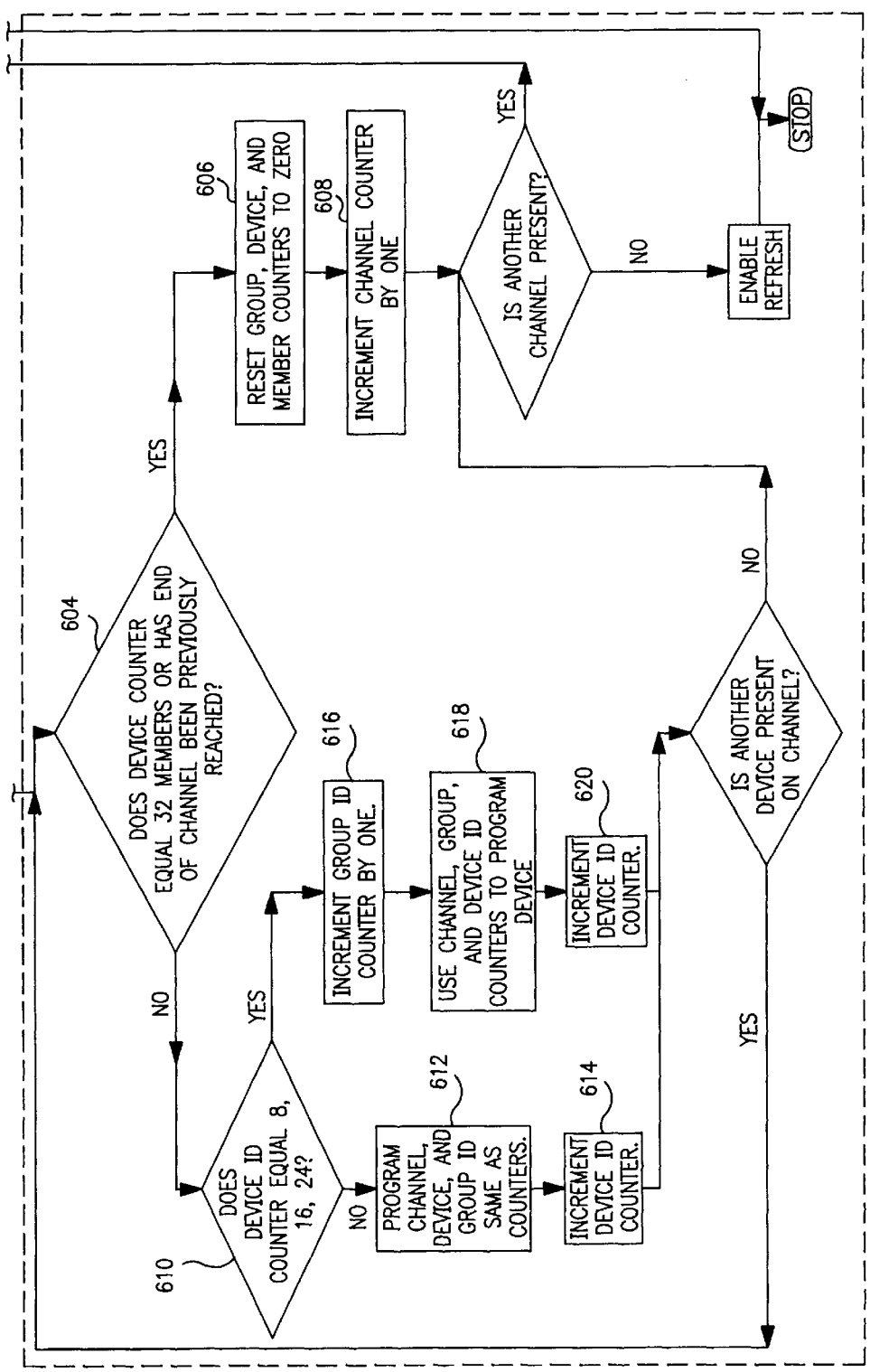

FIGS. 6a and 6b represent a flow diagram for BIOS code for the multiple-channel case in which there is no mixing of memory devices within a channel. Also, a serial presence detect (SPD) method is used, where an EEPROM on the Direct RIMM module provides information concerning the RDRAM devices on the RIMM. Consequently, in step 602, the device characteristics are read from the EEPROM rather than directly from the RDRAM devices. In step 604, it is determined whether the device counter equals 32 or if the end of a channel has previously been reached. If step 604 is answered in the affirmative, then steps 606 and 608 are performed to reset the group, device and member counters to zero and to increment the channel counter by one. If step 604 is answered in the negative, then step 610 determines whether the device counter is equal to various multiples of the group size, which in the embodiment of FIG. 6 is 8, 16, or 24. The remaining steps 612–620 following step 610 perform the proper counter increments and resets needed to group the RDRAM devices into groups of size 8.

Figure 7A:
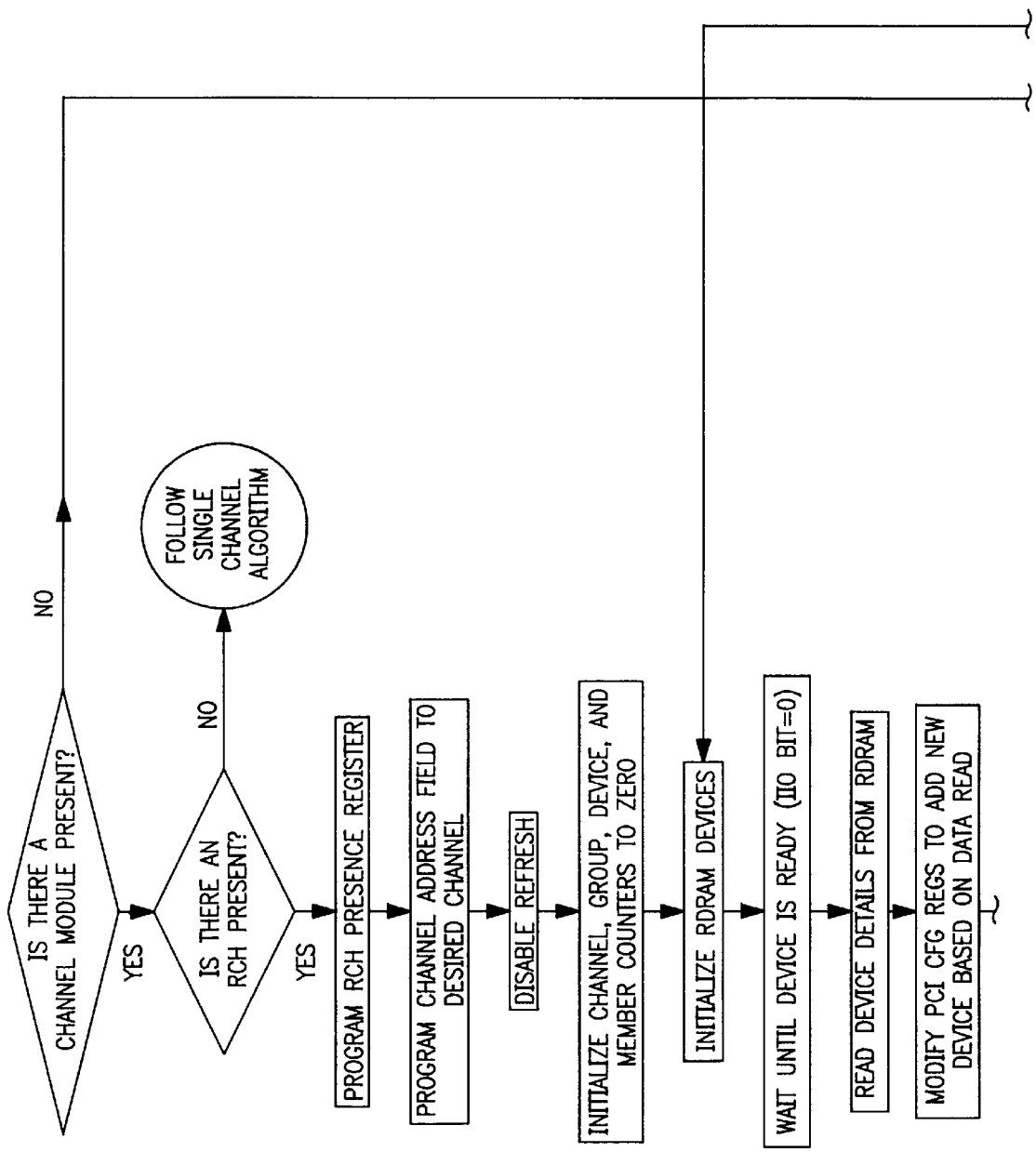
FIGS. 7a, b, c, and d represent a flow diagram for BIOS code for detecting and grouping memory for a multi-channel Direct Rambus RIMM module with memory devices having varying characteristics.
Figure 7B:
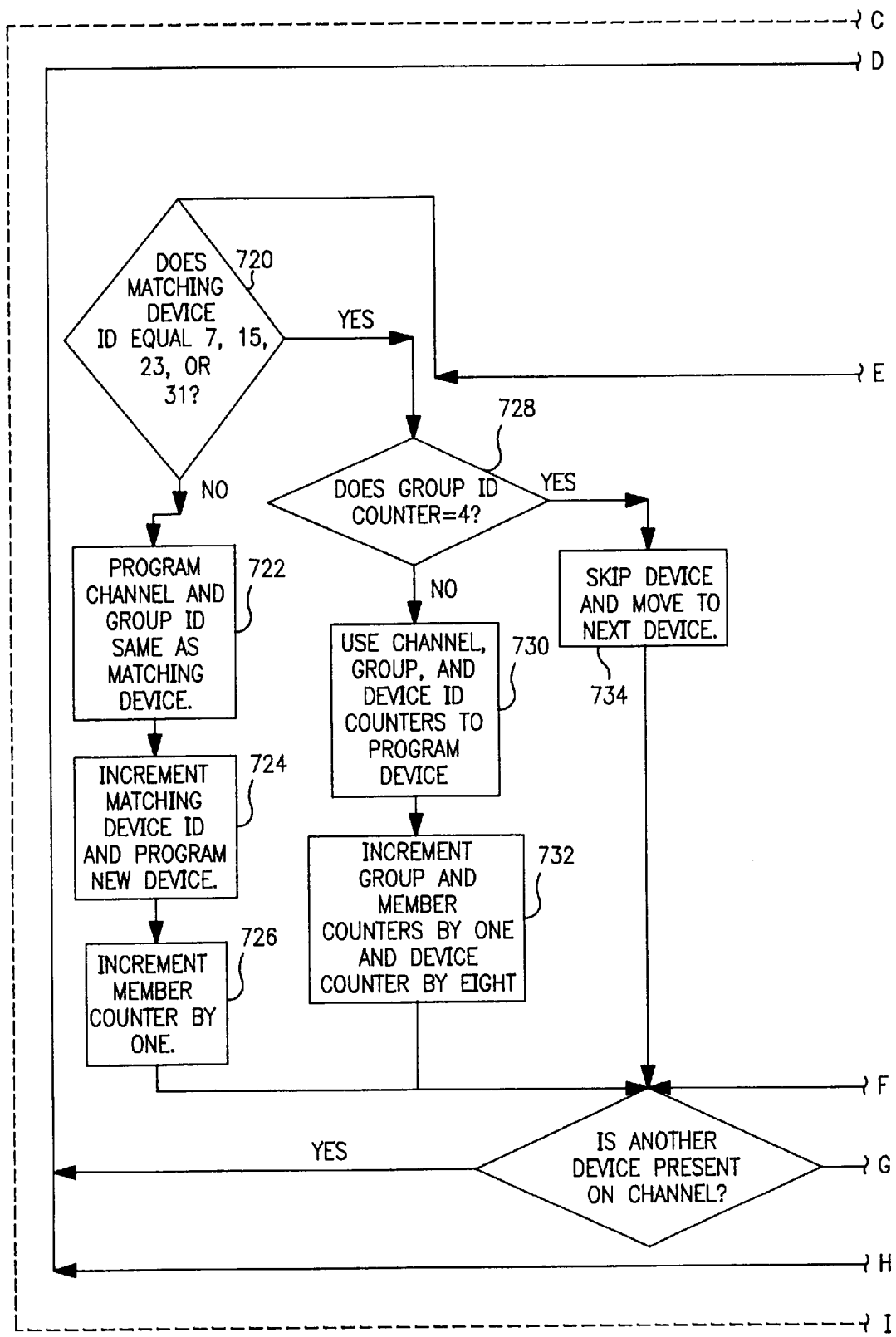
Figure 7C:
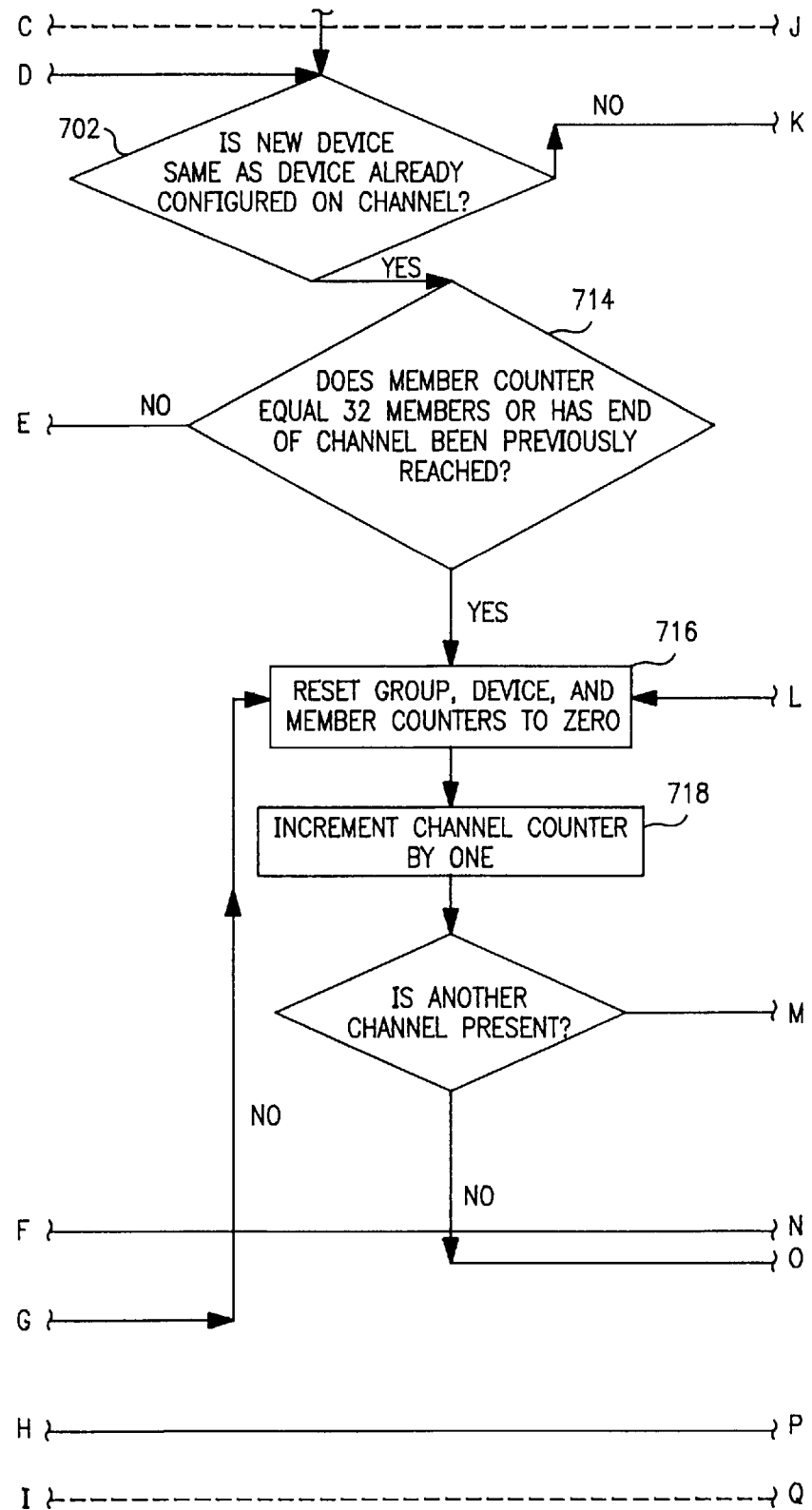
Figure 7D:
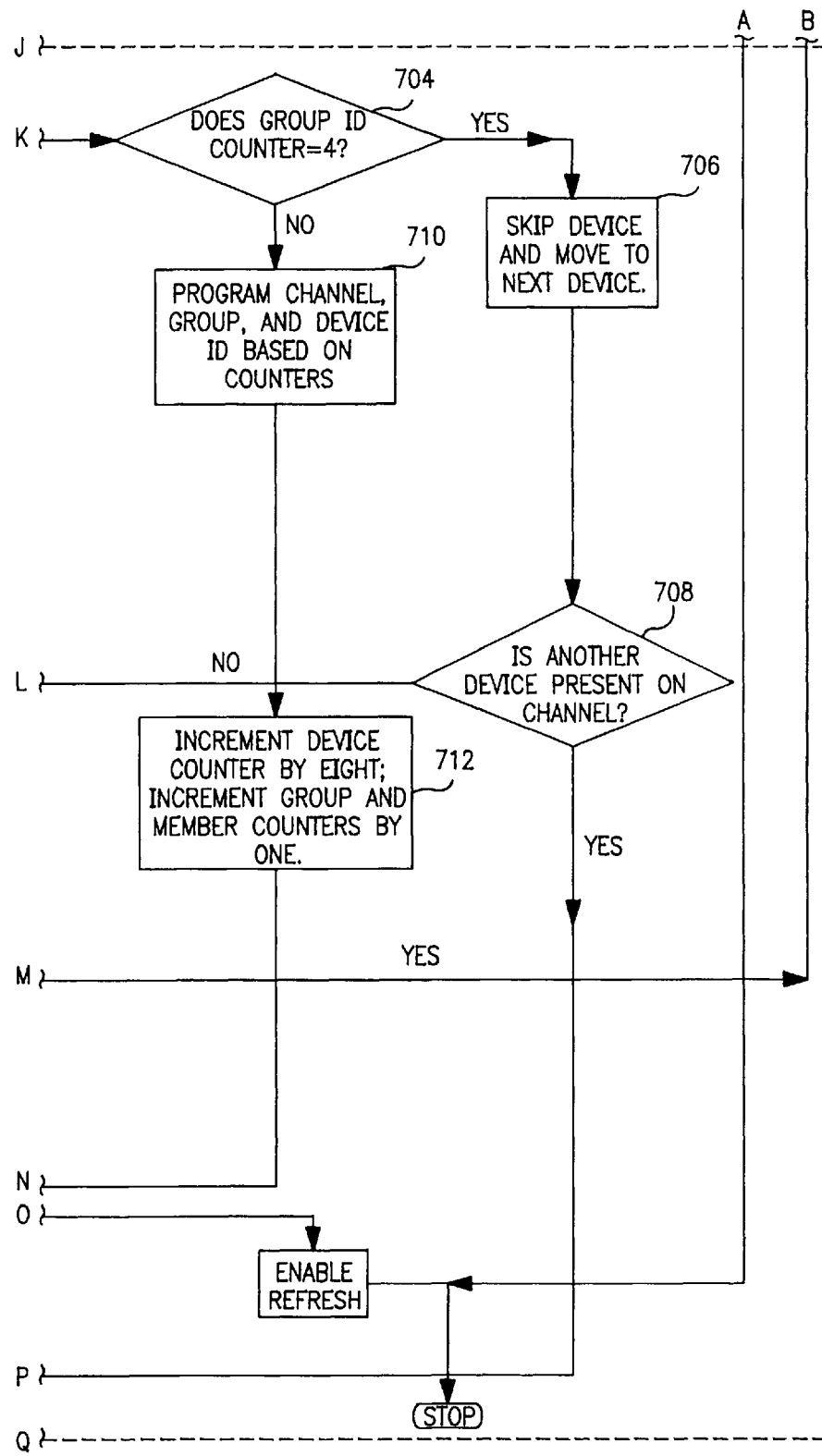

FIGS. 7a, b, c, and d represent a flow diagram for BIOS code for the multiple-channel case in which various memory devices with varying characteristics may be present on the same memory channel. The embodiment of FIG. 7 limits the maximum number of useable RDRAMs per group to 8, for a total of 4 useable groups for any single channel. However, other embodiments may be limited to different values. Step 702 determines whether the characteristics of the newly read RDRAM have already been read for other RDRAM devices on the same channel. If not, then step 704, along with the steps 706 and 708, limit the number of useable groups on a single channel to 4. If the number of groups is less than 4, then step 710 programs the channel ID, group ID, and device ID registers based upon the corresponding counters, and step 712 increments the device counter by 8, and increments the group and member counters by one.

Step 714, followed by steps 716 and 718, limit the useable RDRAM to 32 members for each channel. If the characteristics of the newly read RDRAM match characteristics that have already been read, and if the number of RDRAM devices on a channel does not exceed 32 and if the last RDRAM device on the memory channel has not been reached, then step 720 determines whether the device ID register with the largest value among the group of RDRAMs matching the newly read characteristics is equal to multiples of one less the group size, which is seven for this embodiment. If step 720 is answered in the negative, indicating that the previously read group is not full, then the following steps 722–726 group the newly read RDRAM with that group and update the appropriate counters. If step 720 is answered in the affirmative, and if step 728 is answered in the negative, then the number of groups on the memory channel have not exceeded 4 and steps 730 and 732 program the channel ID, group ID, and device ID based upon the appropriate counters. Steps 728 and 734 limit the useable number of groups on a memory channel to 4.

It is to be understood that some of the various registers described in the disclosed embodiments and in the claims below need not be physically distinct from each other. For example, a device ID register and a group ID register for a memory device may actually be distinct fields within one physical register. Various modifications may be made to the disclosed embodiments without departing from the scope of the invention as claimed below.

What is claimed is:

1. A method for grouping memory devices connected to a memory channel, the method comprising:
   reading characteristics of a memory device connected to the memory channel; and
   if the characteristics have not been previously read, then programming device ID and group ID registers based upon a device counter and a group counter, respectively, and incrementing the device counter by g, where g is a group size, and incrementing the group counter by one.

2. The method as set forth in claim 1, further comprising:
   if the characteristics have been previously read and if a group x of memory devices with the previously read characteristics is less than g in size, then programming the group ID register to indicate m, where m is the group ID of group x, and programming the device ID register to indicate a+1, where a is the largest device ID among group x.

3. The method as set forth in claim 1, further comprising:
   if the characteristics have been previously read and if a group x of memory devices with the previously read characteristics is g in size, then programming device ID and group ID registers based upon the device counter and the group counter, respectively, and incrementing the device counter by g and the group counter by one.

4. The method as set forth in claim 2, further comprising:
   if the characteristics have been previously read and if group x is g in size, then programming device ID and group ID registers based upon the device counter and the group counter, and incrementing the device counter by g and the group counter by one.

5. A computer readable device with stored BIOS code to program an at least one processor to:
   read characteristics of a memory device connected to a memory channel; and
   if the characteristics have not been previously read, then program device ID and group ID registers based upon a device counter and a group counter, respectively, increment the device counter by g, where g is a group size, and increment the group counter by one.

6. The computer readable device as set forth in claim 5, the BIOS code to further program the at least one processor to:
   if the characteristics have been previously read and if a group x of memory devices with the previously read characteristics is less than g in size, then program the group ID register of the memory device to indicate m, where m is the group ID of group x, and program the device ID register of the memory device to indicate a+1, where a is the largest device ID among group x.

7. The computer readable device as set forth in claim 5, the BIOS code to further program the at least one processor to:
   if the characteristics have been previously read and if a group x of memory devices with the previously read characteristics is g in size, then program device ID and group ID registers based upon the device counter and the group counter, respectively, and increment the device counter by g and the group counter by one.

8. The computer readable device as set forth in claim 6, the BIOS code to further program the at least one processor to:
   if the characteristics have been previously read and if group x is g in size, then program device ID and group ID registers based upon the device counter and the group counter, respectively, and increment the device counter by g and the group counter by one.

9. A method for grouping memory devices connected to at least one memory channel, the method comprising:
   reading characteristics of a memory device connected to the at least one memory channel; and
   if the characteristics have not been previously read, then programming channel ID, group ID, and device ID registers based upon channel, group, and device counters, respectively, and incrementing the group counter, the device counter, and a member counter by one.

10. The method as set forth in claim 9, further comprising:
    if the characteristics of the memory device have been previously read, and if the device counter indicates d or if all memory devices connected to the memory channel to which the memory device is connected have previously had their characteristics read, where d is a channel member size, then reset the group, device, and member counters to zero and increment the channel counter by one.

11. The method as set forth in claim 10, further comprising:
    if the characteristics of the memory device have been previously read, if the device counter does not indicate d and if all memory devices connected to the memory channel to which the memory device is connected have not had their characteristics previously read, and if the member counter is less than g, where g is a group size, then programming the channel ID register and group ID register of the memory device to indicate c and m, respectively, where c and m are respectively the channel ID and the group ID of a group x, where the group x of memory devices is the most recently read group of memory devices having the characteristics, programming the device ID register of the memory device based upon the device counter, and incrementing the device and member counters by one.

12. The method as set forth in claim 11, further comprising:
    if the characteristics of the memory device have been previously read, if the device counter does not indicate d and if all memory devices connected to the memory channel to which the memory device is connected have not had their characteristics previously read, and if the member counter indicates g, then programming the channel ID register, group ID register, and device ID register based upon the channel, device, and group counters, respectively, resetting the member counter to one, and incrementing the group and device counters by one.

13. A method for grouping memory devices connected to at least one memory channel, the method comprising:

reading characteristics of a memory device connected to the at least one memory channel; and if a device counter indicates a member size d or if all memory devices connected to the memory channel to which the memory device is connected have had their characteristics previously read, then resetting group, device, and member counters to zero, and incrementing a channel counter by one.

14. The method as set forth in claim 13, further comprising:

if a device counter does not indicate d and if all memory devices connected to the memory channel to which the memory device is connected have not had their characteristics previously read, then determining whether the device counter indicates ng, n=1, 2, ..., N−1 where g is a group size and N is such that Ng=d, and if true, incrementing the group counter by one, programming the channel ID, group ID, and device ID registers based upon the current values of the channel, group, and device counters, respectively, and incrementing the device counter by one, and if false, programming the channel ID, group ID, and device ID registers based upon the current value of the channel, group, and device counters, respectively, and incrementing the device counter by one.

15. A method for grouping memory devices connected to at least one memory channel, the method comprising:

(i) reading characteristics of a memory device connected to the at least one memory channel; and (ii) determining whether the characteristics have already been read for another memory device connected to the same memory channel to which the memory device is connected.

16. The method as set forth in claim 15, further comprising:

(iii) if step ii is answered in the negative, then determining whether a group counter indicates k, where k is the maximum number of groups per memory channel;

(iv) if step iii is answered in the positive, then not grouping the memory device and determining if another memory device is connected to the memory channel to which the memory device is connected;

(v) if in step iv it is determined that another memory device is not present on the memory channel, then resetting the group counter, a device counter, and a member counter to zero and incrementing a channel counter by one; and (vi) if step iii is answered in the negative, then programming a channel ID register, a group ID register, and a device ID register based upon the channel, group, and device counters, respectively, and incrementing the device counter by g, where g is a group size, and incrementing the group and member counters by one.

17. The method as set forth in claim 16, further comprising:

(vii) if step ii is answered in the positive, then determining whether the member counter indicates a member size d or whether all memory devices connected to the memory channel to which the memory device is connected have had their characteristics read;

(viii) if step vii is answered in the positive, then resetting the group, device, and member counters to zero, incrementing the channel counter by one, and determining if another memory channel is present; and (ix) if step vii is answered in the negative, then determining whether a indicates ng−1, n=1, 2, ..., N, where N is such that Ng=d, where a is the largest device ID among a group x of memory devices with characteristics matching the characteristics of the memory device, the group x being the most recently read group of memory devices having the characteristics.

18. The method as set forth in claim 17, further comprising:

(x) if step ix is answered in the negative, then setting the channel ID register to c and the group register to m, where c and m are the channel ID and group ID of group x, respectively, setting the device ID register to a+1 where a is the maximum device ID among group x and incrementing the member counter by one;

(xi) if step ix is answered in the positive, then determining whether the group counter indicates M, where M is a maximum number of groups per channel; and (xii) if step xi is answered in the negative, then programming the channel ID, group ID, and device ID registers based upon the channel, group, and device counters, respectively, incrementing the group and member counters by one, and incrementing the device counter by g.

19. A computer readable device with stored BIOS code, the BIOS code causing at least one processor to perform:

(i) reading characteristics of a memory device connected to the at least one memory channel; and (ii) determining whether the characteristics have already been read for another memory device connected to the same memory channel to which the memory device is connected.

20. The computer readable device as set forth in claim 19, further comprising:

(iii) if step ii is answered in the negative, then determining whether a group counter indicates k, where k is the maximum number of groups per memory channel;

(iv) if step iii is answered in the positive, then not grouping the memory device and determining if another memory device is connected to the memory channel to which the memory device is connected;

(v) if in step iv it is determined that another memory device is not present on the memory channel, then resetting the group counter, a device counter, and a member counter to zero and incrementing a channel counter by one; and (vi) if step iii is answered in the negative, then programming a channel ID register, a group ID register, and a device ID register based upon the channel, group, and device counters, respectively, and incrementing the device counter by g, where g is a group size, and incrementing the group and member counters by one.

21. The computer readable device as set forth in claim 20, further comprising:

(vii) if step ii is answered in the positive, then determining whether the member counter indicates a member size d or whether all memory devices connected to the memory channel to which the memory device is connected have had their characteristics read;

(viii) if step vii is answered in the positive, then resetting the group, device, and member counters to zero, incrementing the channel counter by one, and determining if another memory channel is present; and (ix) if step vii is answered in the negative, then determining whether a indicates ng−1, n=1, 2, ..., N, where N is such that Ng=d, where a is the largest device ID among a group x of memory devices with characteristics matching the characteristics of the memory device, the group x being the most recently read group of memory devices having the characteristics.

22. The computer readable device as set forth in claim 21, further comprising:

(x) if step ix is answered in the negative, then setting the channel ID register to c and the group register to m, where c and m are the channel ID and group ID of group x, respectively, setting the device ID register to a+1 where a is the maximum device ID among group x, and incrementing the member counter by one;

(xi) if step ix is answered in the positive, then determining whether the group counter indicates M, where M is a maximum number of groups per channel; and (xii) if step xi is answered in the negative, then programming the channel ID, group ID, and device ID registers based upon the channel, group, and device counters, respectively, incrementing the group and member counters by one, and incrementing the device counter by g.

* * * * *